(12) United States Patent
Kitano et al.

(10) Patent No.: US 9,337,139 B2
(45) Date of Patent: May 10, 2016

(54) SEMICONDUCTOR DEVICE HAVING COMPENSATION CAPACITOR TO STABILIZE POWER SUPPLY VOLTAGE

(71) Applicant: PS4 Luxco S.a.r.l., Luxembourg (LU)

(72) Inventors: Tomohiro Kitano, Tokyo (JP); Hisayuki Nagamine, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 338 days.

(21) Appl. No.: 13/800,978

(22) Filed: Mar. 13, 2013

(65) Prior Publication Data

US 2013/0258792 A1    Oct. 3, 2013

(30) Foreign Application Priority Data

Mar. 30, 2012   (JP) ................. 2012-078638

(51) Int. Cl.
| | |
|---|---|
| *H01L 23/522* | (2006.01) |
| *G11C 5/14* | (2006.01) |
| *G11C 5/04* | (2006.01) |
| *G11C 5/06* | (2006.01) |
| *H01L 23/48* | (2006.01) |
| *H01L 23/31* | (2006.01) |
| *H01L 25/065* | (2006.01) |

(52) U.S. Cl.
CPC ............. *H01L 23/5223* (2013.01); *G11C 5/04* (2013.01); *G11C 5/06* (2013.01); *G11C 5/14* (2013.01); *H01L 23/481* (2013.01); *H01L 23/3128* (2013.01); *H01L 25/0657* (2013.01); *H01L 2224/14181* (2013.01); *H01L 2224/16145* (2013.01); *H01L 2224/16225* (2013.01); *H01L 2924/13091* (2013.01); *H01L 2924/15311* (2013.01)

(58) Field of Classification Search
CPC .............................. H01L 23/5223; G11C 5/14
USPC ....................... 365/189.17; 257/296
See application file for complete search history.

(56) References Cited

U.S. PATENT DOCUMENTS

| | | | |
|---|---|---|---|
| 8,350,389 B2 | 1/2013 | Itaya et al. | |
| 2010/0109063 A1* | 5/2010 | Hayashida | H01L 27/0629 257/300 |
| 2011/0193086 A1* | 8/2011 | Lee et al. | 257/48 |
| 2011/0204438 A1* | 8/2011 | Taniguchi | 257/331 |
| 2012/0056298 A1* | 3/2012 | Kuroki | 257/532 |

FOREIGN PATENT DOCUMENTS

JP    2011-82450 A    4/2011

* cited by examiner

*Primary Examiner* — Hoai V Ho
*Assistant Examiner* — Tri Hoang

(57) ABSTRACT

Disclosed herein is a device that includes: first and second memory cell arrays arranged in a first direction; a plurality of first bump electrodes disposed between the first and second memory cell arrays and arranged in line in a second direction crossing the first direction; a plurality of second bump electrodes disposed between the first bump electrodes and the second memory cell arrays and arranged in line in the second direction; a first area being between the first and second bump electrodes; a plurality of third bump electrodes disposed in the first area; and a first capacitor formed in the third area.

18 Claims, 21 Drawing Sheets

FIG.6

SEMICONDUCTOR DEVICE HAVING COMPENSATION CAPACITOR TO STABILIZE POWER SUPPLY VOLTAGE

This application claims priority to Japanese patent application no. 2012-078638, filed Mar. 30, 2012, the entire contents of which is incorporated herein by reference.

BACKGROUND OF THE INVENTION

1. Field of the Invention

The present invention relates to a semiconductor device, and more particularly relates to a semiconductor device including a power compensation capacitor.

2. Description of Related Art

In recent years, there have been proposed stacked semiconductor devices in which a plurality of semiconductor chips including penetration electrodes are stacked (see Japanese Patent Application Laid-open No. 2011-82450). In a stacked semiconductor device described in Japanese Patent Application Laid-open No. 2011-82450, core chips in which only so-called back-end parts are integrated and interface chips in which so-called front-end parts are integrated are stacked. Electrical connection between the chips is made by penetration electrodes that are provided while penetrating through the chips.

Although the type thereof is different from that of the stacked semiconductor device described in Japanese Patent Application Laid-open No. 2011-92450, in recent years, there have been developed wide I/O semiconductor devices that significantly increase the bit number of data that can be input and output at the same time by stacking a plurality of memory chips that can operate by themselves and by connecting each of chips using penetration electrodes.

Because many data input/output circuits operate at the same time in the wide I/O semiconductor devices, it becomes necessary to provide many power compensation capacitors in the chips in order to sufficiently stabilize a power supply voltage. Therefore, a chip area increases as compared with a chip area of conventional semiconductor chips.

SUMMARY

In one embodiment, there is provided a device that includes: first and second memory cell arrays arranged in a first direction; a plurality of first bump electrodes disposed between the first and second memory cell arrays and arranged in line in a second direction crossing the first direction; a plurality of second bump electrodes disposed between the first bump electrodes and the second memory cell arrays and arranged in line in the second direction; a first area being between the first and second bump electrodes; a plurality of third bump electrodes disposed in the first area; and a first capacitor formed in the third area.

In another embodiment, there is provided a device that includes: first and second memory cell arrays; a first data input/output circuit that performs a data transfer from and to the first memory cell array; a second data input/output circuit that performs a data transfer from and to the second memory cell array; a plurality of bump electrodes arranged in a first area which is positioned between the first data input/output circuit and the second data input/output circuit; and a power compensation capacitor provided in the first penetration electrode forming area.

BRIEF DESCRIPTION OF THE DRAWINGS

FIG. 4 is a functional block diagram of the channel Ch_a;

FIG. 6 is a plan view of a more detailed layout of the front surface bump electrodes PL_a shown in FIG. 5;

DETAILED DESCRIPTION OF THE EMBODIMENTS

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1A:
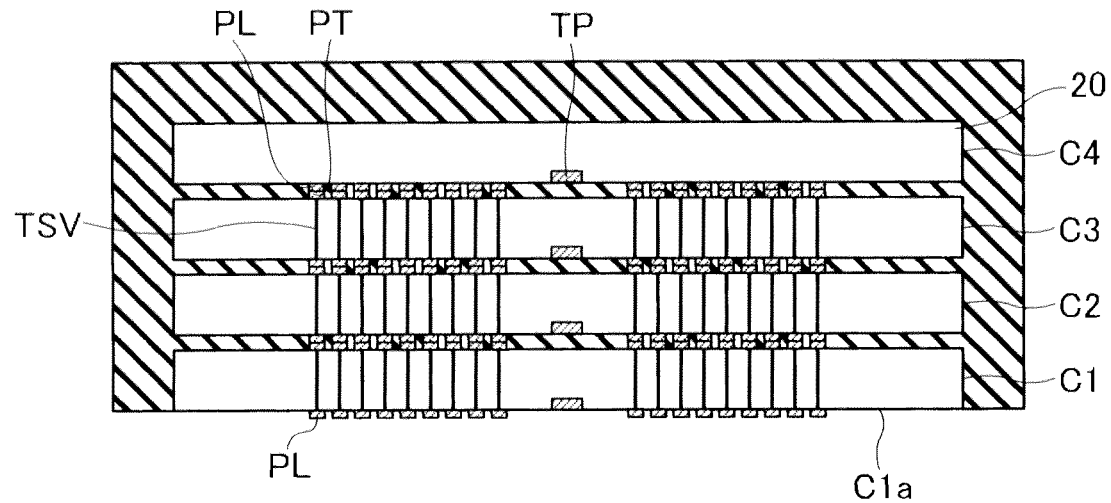
FIG. 1A is a schematic cross-sectional view of a semiconductor device according to an embodiment of the present invention.

Referring now to FIG. 1A, the semiconductor device 1 according to an embodiment is a so-called wide IO DRAM having a configuration in which four memory chips C1 to C4 having the same function and the same configuration and manufactured with the same mask are stacked sequentially in this order from the bottom. Each of the memory chips C1 to C4 functions as a so-called DRAM, including a memory cell array and peripheral circuits of the memory cell array (not shown in FIG. 1A). The peripheral circuits include a data input/output circuit that performs input and output of data between the memory cell array and outside, a control circuit that controls the input and output operations of the data in response to a command supplied from outside. The memory chips C1 to C4 are sealed with a resin in a state of being stacked, and function as a memory device that is integrally packaged.

Figure 1B:
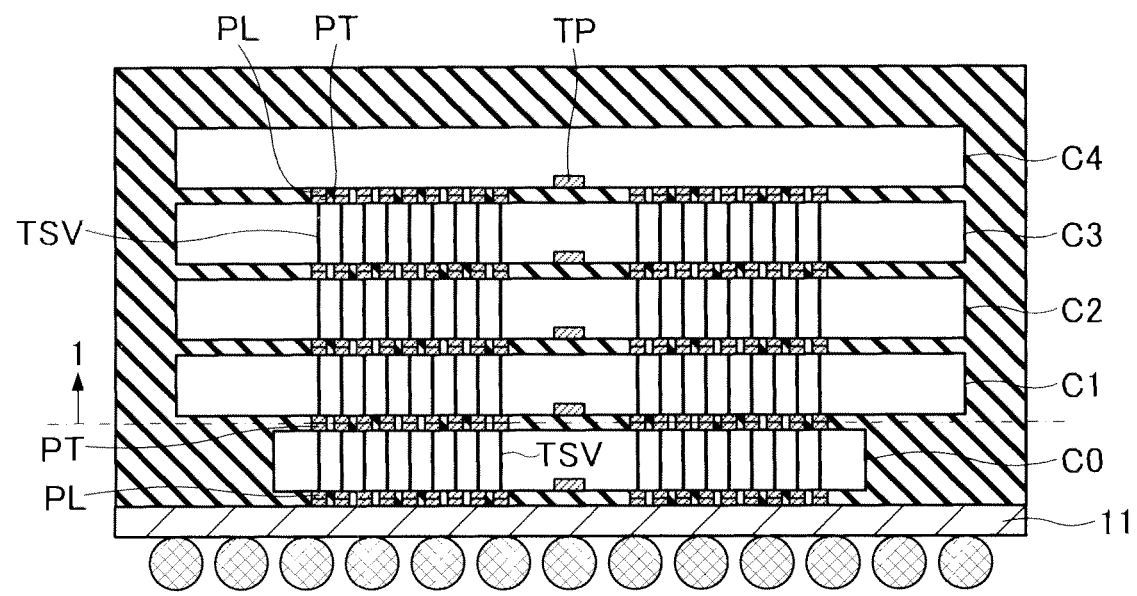
FIG. 1B is a schematic cross-sectional view to explain a structure of a composite semiconductor device into which the semiconductor device shown in FIG. 1A is integrated.

The semiconductor device 1 is a semifinished product, which is provided to an end user as a composite semiconductor device 10 in which the semiconductor device 1 is stacked on a package substrate 11 with a controller chip C0 as shown in FIG. 1B. The controller chip C0 is a semiconductor chip in which a logic circuit is formed on a top surface or a bottom surface of a semiconductor substrate, and is also referred to as "SOC (System On Chip)". The logic circuit in the controller chip C0 controls operations of the memory chips C1 to C4 that are DRAMs. The controller chip C0 and the semiconductor device 1 are integrally sealed with a resin as shown in FIG. 1B. Therefore, a bottom surface C1a of the memory chip C1 is out of the end user's sight.

As shown in FIG. 1A, each of the memory chips C1 to C4 includes a semiconductor substrate (for example, a silicon substrate) 20, and the internal circuit mentioned above is formed on the bottom surface of the semiconductor substrate 20. That is, the memory chips C1 to C4 are stacked in a face-down manner. A plurality of front surface bump electrodes PL are formed on the bottom surface of the memory chips C1 to C4, and a plurality of back surface bump electrodes PT are formed on the top surface of the memory chips C1 to C3. Each of the front surface bump electrodes PL is electrically connected to an associated one of the back surface bump electrode PT provided on the same memory chip by a penetration electrode TSV that penetrates through the semiconductor substrate 20. The penetration electrodes TSV may be called through-electrodes, through-vias, or through-substrate vias. Further, the back surface bump electrodes PT of each of the memory chips C1 to C3 is contacted with the front surface bump electrodes PL of a memory chip on a layer right above. With this configuration, the front surface bump electrodes PL of each of the memory chips C1 to C4 are drawn to the bottom surface C1a of the memory chip C1 on the lowermost layer.

The uppermost memory chip C4 does not have a penetration electrode TSV. This is because the back surface bump electrodes PT are not necessary on the uppermost memory chip C4 since the memory chips C1 to C4 are stacked in a face-down manner. Therefore, the uppermost memory chip C4 can be thicker than the other memory chips C1 to C3. In this case, a mechanical strength of the semiconductor device 1 can be improved. Note that the penetration electrodes TSV can be formed on the uppermost memory chip C4. In this case, the uppermost memory chip C4 can be manufactured by the same process as the memory chips C1 to C3.

Figure 2:
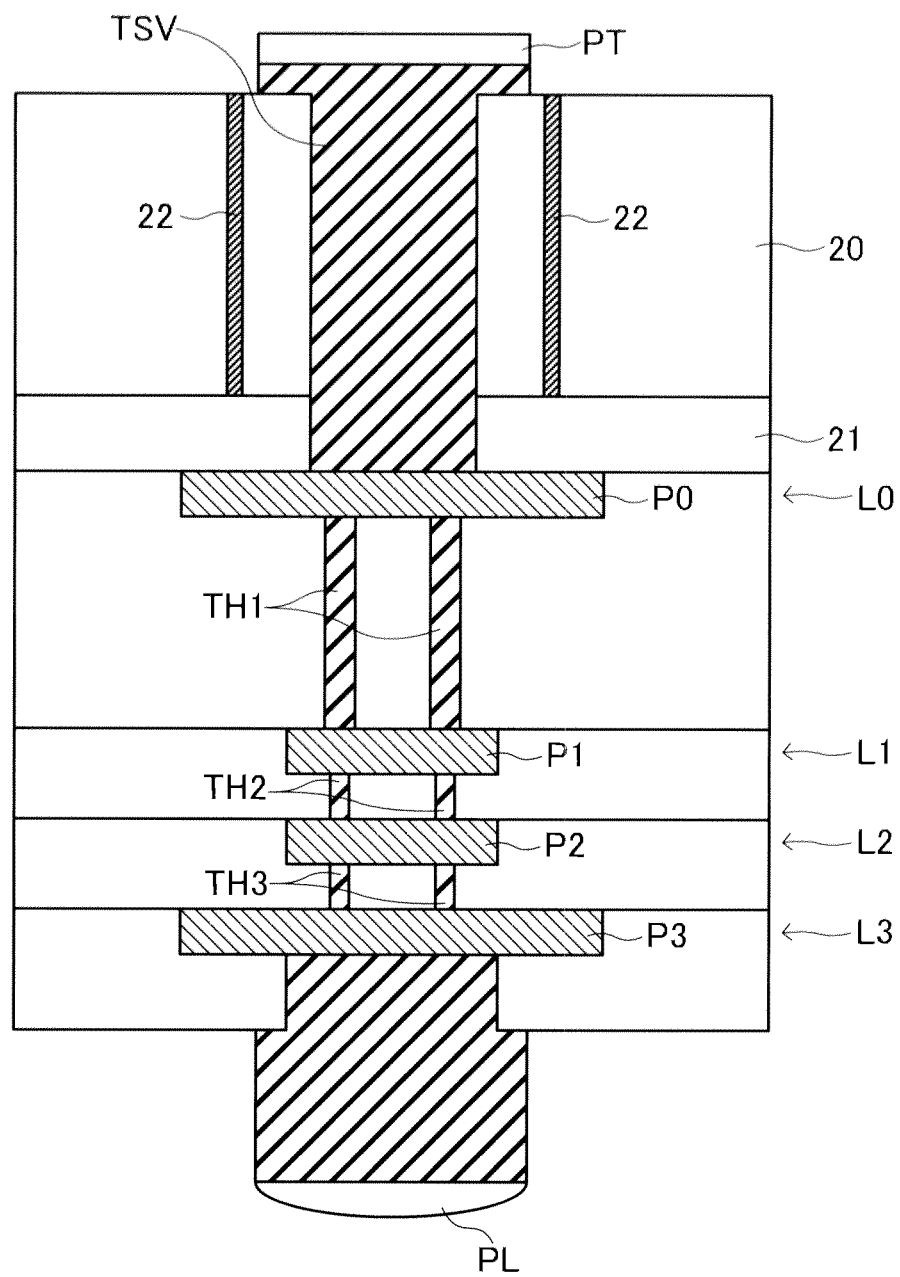
FIG. 2 is a cross-sectional view of the penetration electrode.

As shown in FIG. 2, the penetration electrode TSV is formed so as to penetrate the semiconductor substrate 20 and an inter-layer insulation film 21 on a surface of the semiconductor substrate 20. An insulation ring 22 is provided around the penetration electrode TSV, by which insulation is secured between the penetration electrode TSV and a transistor area. Instead of providing the insulation ring 22, an insulation film such as silicon oxide film can be provided on the inner wall of a through silicon via that is to be filled by the penetration electrode TSV.

The lower end of the penetration electrode TSV is connected to the front surface bump electrodes PL provided on the bottom surface of the memory chip via interconnection pads P0 to P3 provided on each of wiring layers L0 to L3 and a plurality of through-hole electrodes TH1 to TH3 connecting between the interconnection pads. On the other hand, the upper end of the penetration electrode TSV is connected to the back surface bump electrodes PT of the memory chip. The wiring layers L0 to L3 compose a multi-level wiring structure. The back surface bump electrodes PT is connected to the front surface bump electrodes PL of the memory chip on the upper layer. With this configuration, two penetration electrodes TSV provided on the different memory chips and provided at the same position in the planar view are short-circuited with each other.

Referring back to FIG. 1A, a test pad TP is further provided on the bottom surface of the semiconductor substrate 20 of each of the memory chips C1 to C4. The test pad TP is a pad for contacting a test probe when testing the memory chip C1 to C4 on the wafer level. Each of the test pads TP is electrically connected to any one of the front surface bump electrodes PL.

Figure 3:
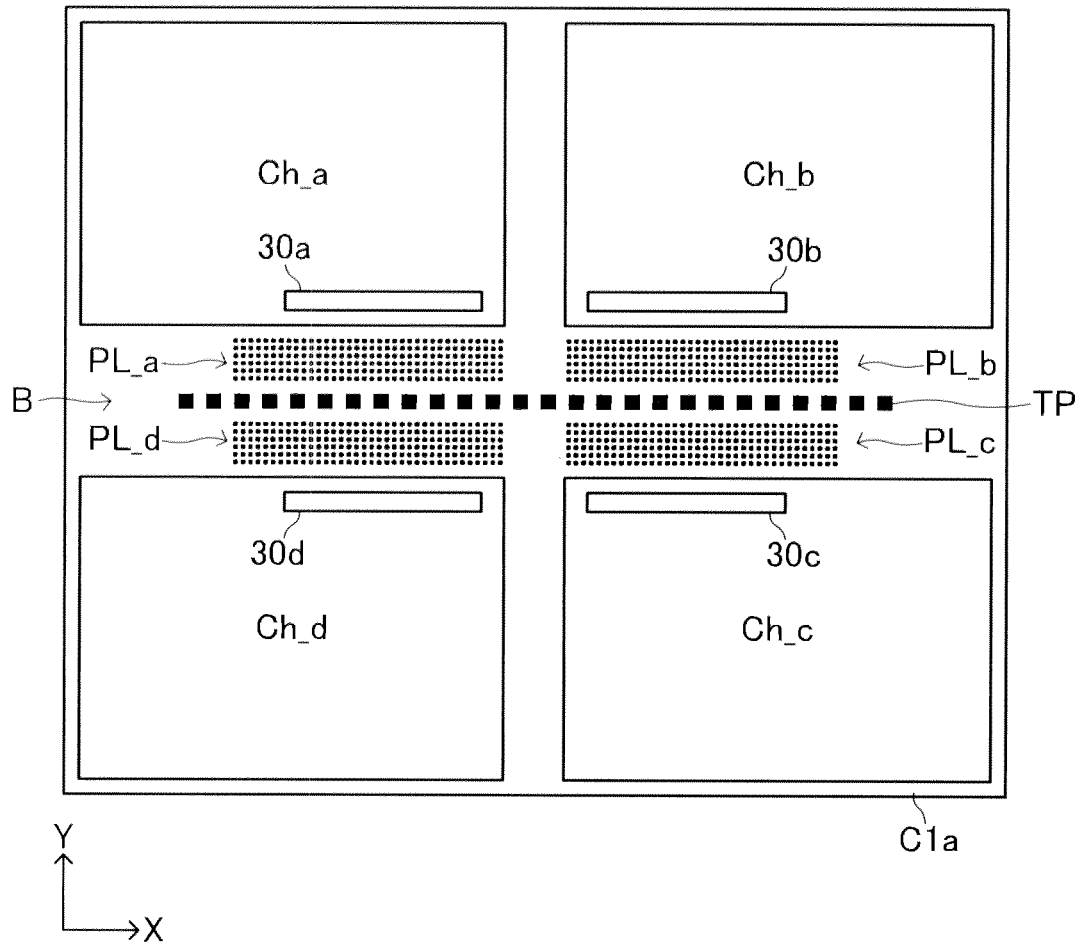
FIG. 3 is a plan view of the bottom surface C1a of the semiconductor chip C1 shown in FIG. 1A.

As shown in FIG. 3, four channels Ch_a to Ch_d, a plurality of front surface bump electrodes PL_a to PL_d corresponding respectively to the channels Ch_a to Ch_d, and a plurality of test pads TP are provided on the bottom surface C1a of the memory chip C1. Although not shown, the other memory chips C2 to C4 also have the same configuration. Each of the channels Ch_a to Ch_d functions as a single DRAM. Therefore, the channels Ch_a to Ch_d are configured to transmit and receive various signals including a command gnat, an address signal, a data signal, and the like with outside independently of each other. That is, the memory chip C1 is configured to perform various operations as a DRAM, such as a read operation, a write operation, a refresh operation, and the like, for each channel independently. The same is true for the other memory chips C2 to C4.

As shown in FIG. 3, the channels Ch_a and Ch_b are arranged on one side in a Y direction, and the channel Ch_c and the channel Ch_d are arranged on the other side in the Y direction. A bump area B is provided between the channels Ch_a and Ch_b and the channels Ch_c and Ch_d, and the front surface bump electrodes PL_a to PL_d and the test pads TP are arranged in the bump area B. Specifically, the front surface bump electrodes PL_a to PL_d are respectively arranged in a plurality of arrays near the corresponding channels in the bump area B, and the test pads TP are arranged in a row in an area between the front surface bump electrodes PL_a and PL_b and the front surface bump electrodes PL_c and PL_d. As shown in FIG. 3, dimensions and intervals of the test pads TP are set to be larger than those of the front surface bump electrodes PL. This arrangement facilitates that the test probe makes contact with the test pads TP. Performing the test of the semiconductor device 1 by using the test pad TP having the above configuration makes it possible to perform the test without causing any damage on the front surface bump electrodes PL_and the penetration electrodes TSV of the memory chip.

The channels Ch_a to Ch_d are provided with data input/output circuits 30a to 30d, respectively. The data input/output circuits 30a to 30d are circuits that input and output data that read from and to be written into memory cell arrays, respectively, in the channels Ch_a to Ch_d. Each of the data input/output circuits 30a to 30d are arranged near a corresponding one of the front surface bump electrodes PL_a to PL_d. This arrangement is provided to shorten the wiring length of data buses between the data input/output circuits 30a to 30d and the corresponding one of the front surface bump electrodes PL_a to PL_d. With this configuration, the front surface bump electrodes PL_a and PL_d are laid out at a position that is sandwiched between the data input/output circuits 30a and 30d, and the front surface bump electrodes PL_b and PL_c are laid out at a position that is sandwiched between the data input/output circuits 30b and 30c. An area in which the front surface bump electrodes PL_a to PL_d are laid out is an area where the penetration electrodes TSV are formed. In the present Specification, this area is also referred to as "penetration electrode forming area". Furthermore, an area in which the test pads TP are provided is an area where the penetration electrodes TSV are not formed. In the present Specification, this area is also referred to as "penetration electrode non-forming area".

Figure 4:
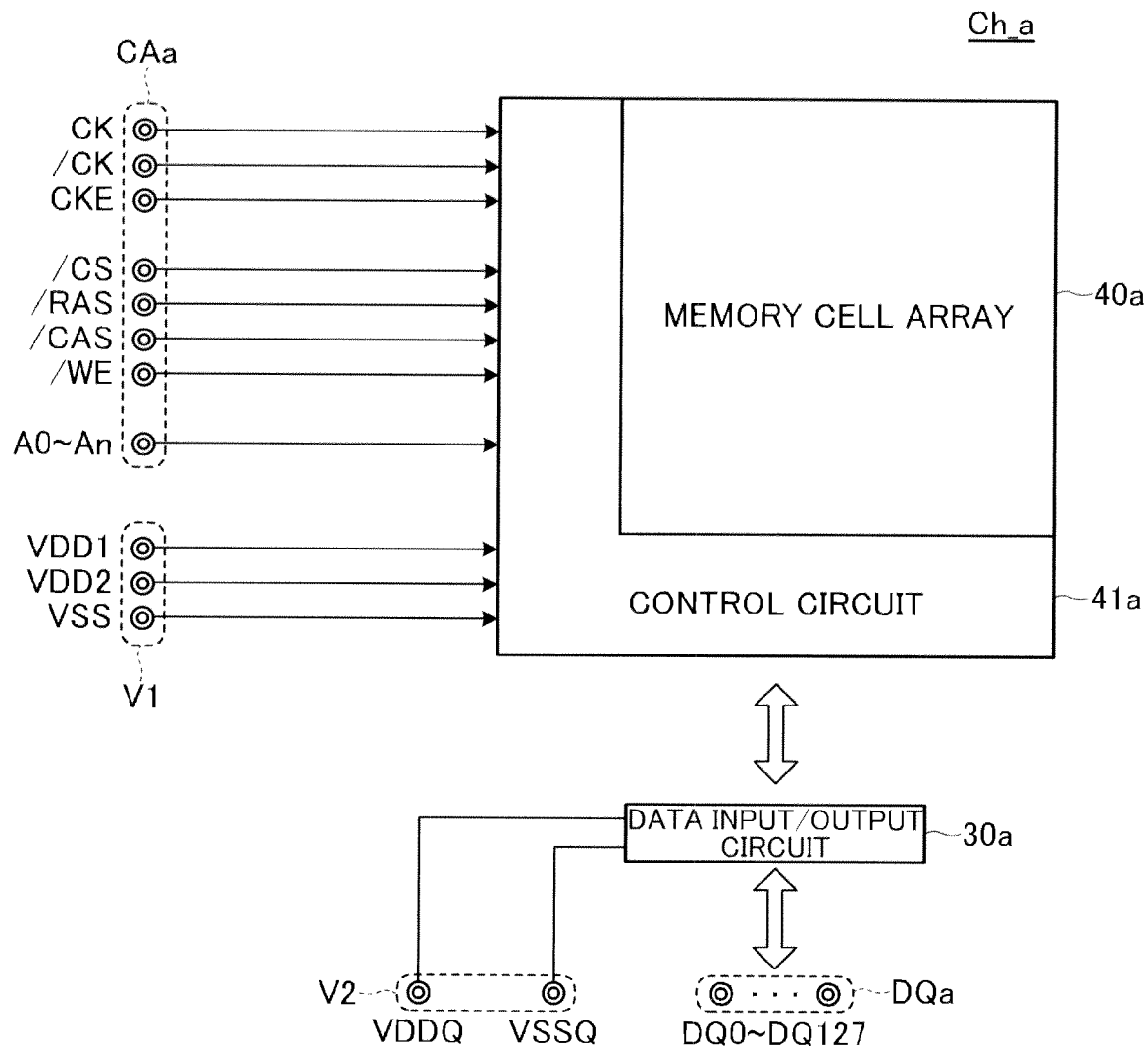

Turning to FIG. 4, the channel Ch_a includes a memory cell array 40a, and a control circuit 41a that controls an operation of the memory cell array 40a. Because the channels Ch_a to Ch_d have mutually the same configuration, the configurations of the channels Ch_b to Ch_d are also as that shown in FIG. 4. The control circuit 41a is a circuit that accesses the memory cell array 40a based on various signals supplied from a command/address system terminal CAa. At a read operation time, the control circuit 41a functions to supply data read from the memory cell array 40a to the data input/output circuit 30a. At a write operation time, the control circuit 41a functions to write data supplied from the data input/output circuit 30a to the memory cell array 40a. Signals supplied to the command/address system terminal CAa include clock signals CK and /CK, a clock enable signal CKE, a chip select signal /CS, a row address strobe signal /RAS, a column address strobe signal /CAS, a write enable signal /WE, and address signals A0 to An. Power supply potentials VDD1 and VDD2 and a ground potential VSS that are supplied from a power supply terminal V1 are used for an operation voltage of the control circuit 41a.

The data input/output circuit 30a operates based on a power supply potential VDDQ and a ground potential VSSQ that are supplied from a power supply terminal V2, and performs data transmission and reception between a data terminal DQa and the control circuit 41a. The power supply terminal V1 and the power supply terminal V2 are separately provided to prevent transmission of power supply noise generated by the data input/output circuit 30a to the control circuit 41a. In the present embodiment, 128 data terminals DQa are provided. With this arrangement, 128-bit data DQ0 to DQ127 can be simultaneously input and output per one channel.

Figure 5:
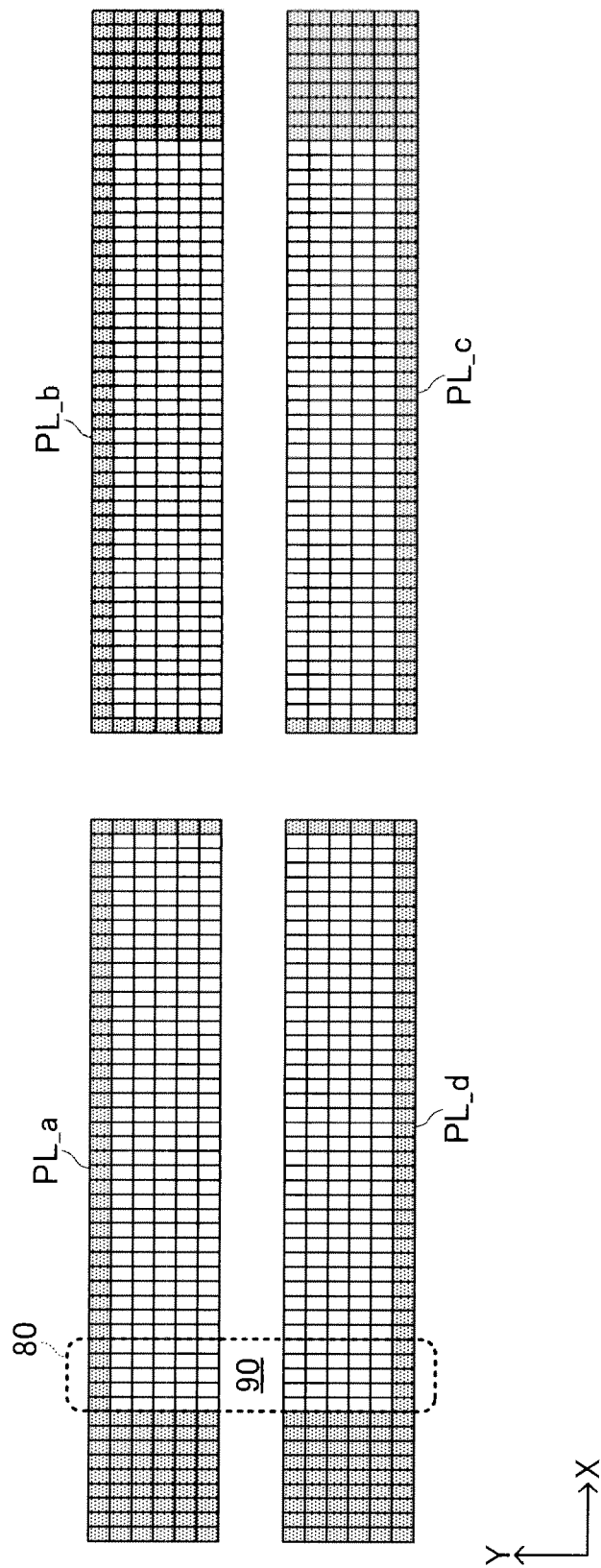
FIG. 5 is a plan view of layouts of the front surface bump electrodes PL_a to PL_d.

As shown in FIG. 5, the front surface bump electrodes PL_a to PL_d are laid out in a matrix form. In FIG. 5, meshed regions are where command/address system terminals CA and power supply terminals V1 are mainly arranged, and unmeshed regions are where data terminals DQ and power supply terminals V2 are mainly arranged. Each of the layout of the front surface bump electrodes PL_a to PL_d is the same as that of the penetration electrodes TSV.

Figure 6:
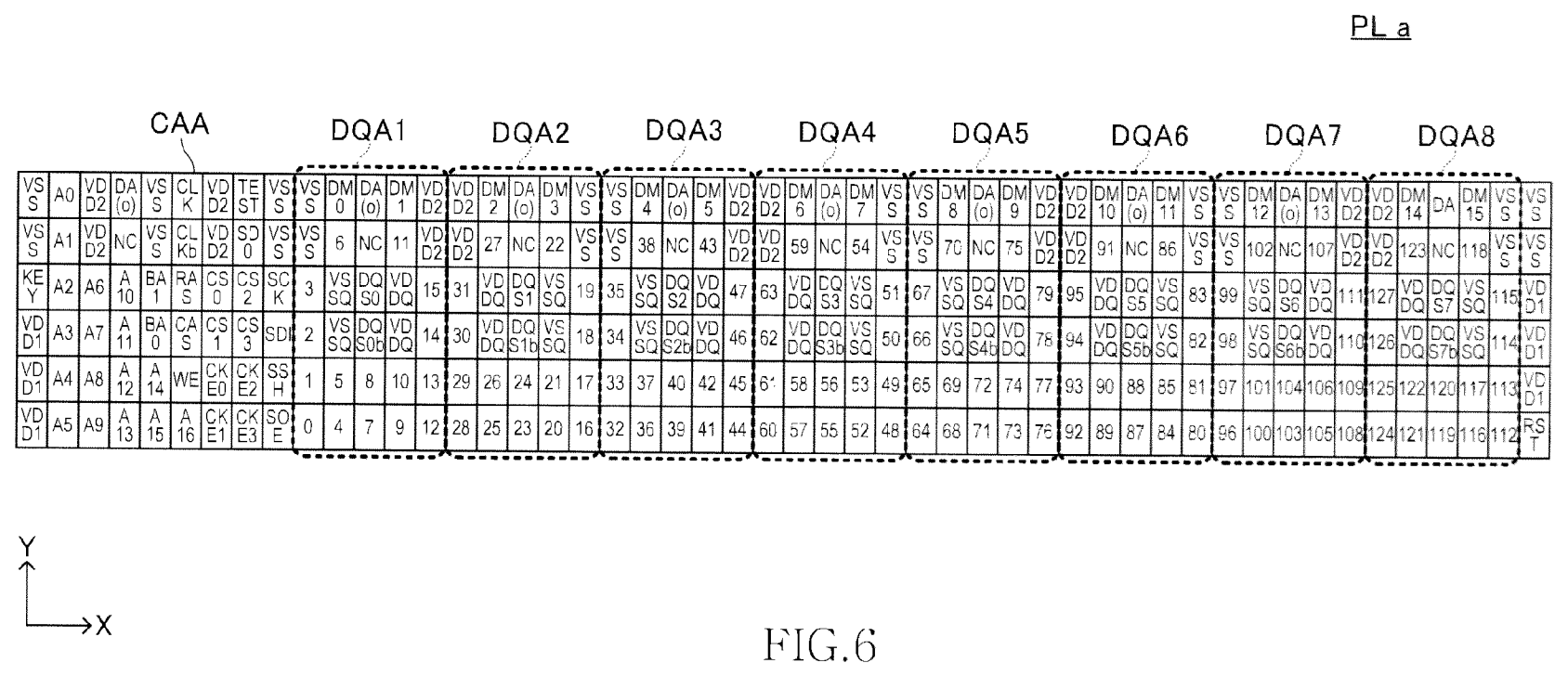

As shown in FIG. 6, an area arranging the front surface bump electrodes PL_a has a penetration electrode forming area CAA in which the command/address system terminal CA and the power supply terminal V1 are arranged, and a plurality of penetration electrode forming areas DQA1 to DQA8 in which the data terminals DQ and the power supply terminals V2 are mainly arranged. The areas DQA1 to DQA8 have mutually substantially the same layout. Focusing attention on the penetration electrode forming area DQA1 as a representative example, 16 data terminals DQ0 to DQ15, the power supply terminal V2 (VDDQ, VSSQ) corresponding to the terminals DQ0 to DQ15, and data strobe terminals DQS0 and DQS1 are provided. In a part of the respective areas DQA1 to DQA8, the power supply terminal V1 (VDD2, VSS) and the like are also provided.

Figure 7C:
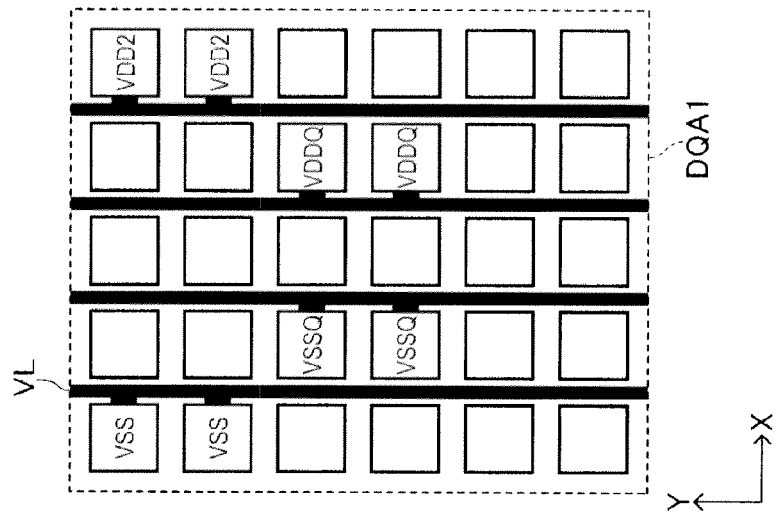
FIGS. 7A to 7C are plan views of more detailed layouts of the penetration electrode forming area in which the inventors have conceived as a prototype in the course of making the present invention.
Figure 7B:
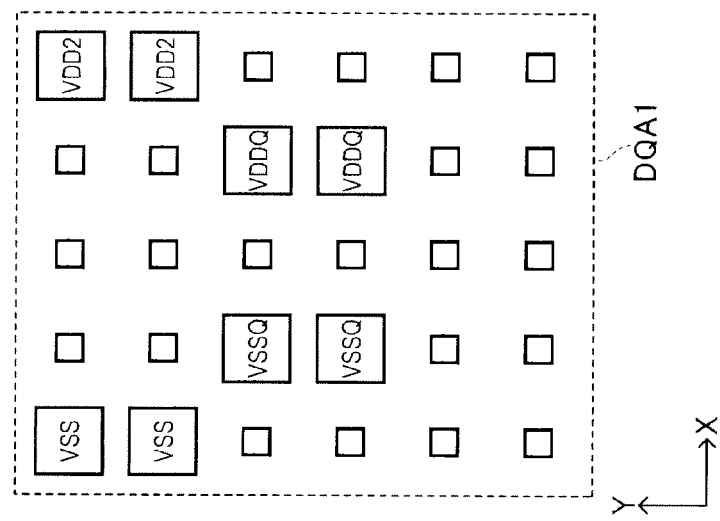
Figure 7A:
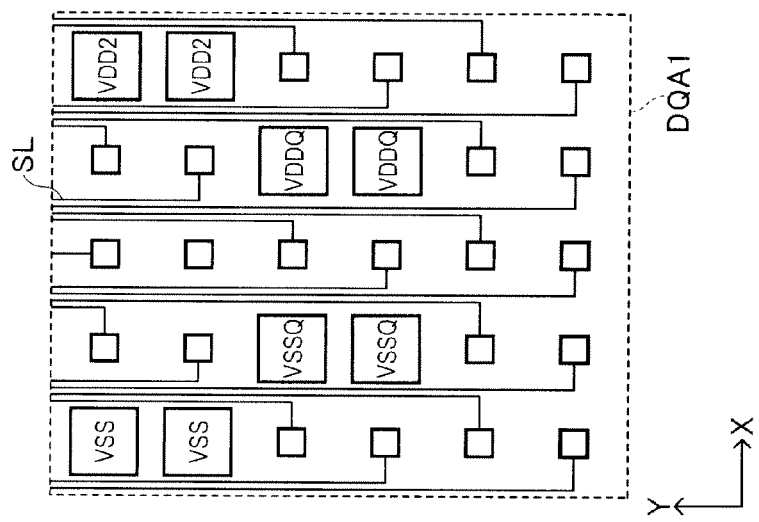

Before explaining some layout according to an embodiment, the prototype example in which the inventors have conceived in the course of making the present invention will be explained with reference to FIGS. 7A to 7C. FIGS. 7A to 7C respectively show layouts of wiring layers L1 to L3. Positions of the wiring layers L1 to L3 in a stacking direction are as those shown in FIG. 2.

As shown in FIGS. 7A to 7C, a total of 30 electrode patterns are formed in the penetration electrode forming area DQA1, which are five electrode patterns in an X direction and six electrode patterns in a Y direction. The 30 electrode patterns are connected respectively to penetration electrodes TSV. Among electrode patterns formed in the wiring layers L1 and L2, electrode patterns assigned to a power supply system are designed to have a large area and electrode patterns assigned to a signal system are designed to have a small area. The electrode patterns assigned to a power supply system are designed to be large to mainly achieve a low resistance and to overcome electromigration. The electrode patterns assigned to a signal system are designed to be small to mainly reduce a parasitic resistance.

The electrode patterns of a power supply system include two patterns to which the power supply potentials VDD2 and VDDQ are supplied and two pattern to which the ground potentials VSS and VSSQ are supplied. On the other hand, the electrode patterns of a signal system include patterns for inputting and outputting the data DQ0 to DQ15, and patterns for inputting and outputting the data strobe terminals DQS0 and DQS1. In this example, among the penetration electrodes TSV that are arranged in the penetration electrode forming area DQA1, penetration electrodes TSV of a signal system are connected to the data input/output circuit 30a via data wiring patterns SL provided in the wiring layer L1. On the other hand, among the penetration electrodes TSV that are arranged in the penetration electrode forming area DQA1, penetration electrodes TSV of a power supply system are connected to the input/output circuit 30a via power supply wiring patterns VL provided in the wiring layer L3.

A layout pattern according to the first embodiment of the present invention will be explained with reference to FIG. 8.

Figure 8:
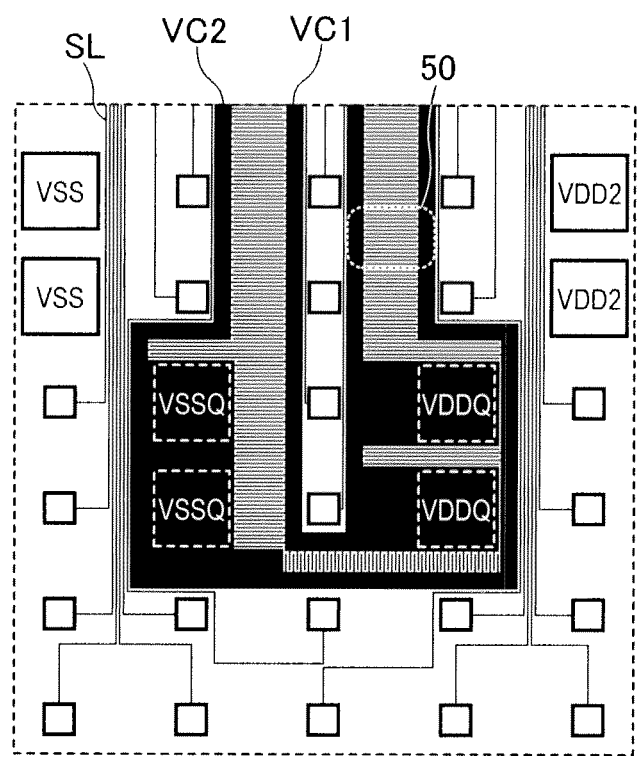
FIG. 8 is a plan view of the penetration electrode forming area according to a first embodiment of the present invention.

FIG. 8 shows a layout of the wiring layer L1 in the penetration electrode forming area DQA1, and a pair of capacitor electrodes formed by the electrode patterns VC1 and VC2 is mutually adjacently provided in a free space of the wiring layer L1 shown in FIG. 7A. The free space is a space in which electrode patterns or the data wiring patterns SL shown in FIG. 7A are not formed. As shown in FIG. 8, the electrode pattern VC1 is integrally provided with electrode patterns to which the power supply potential VDDQ is supplied, and the electrode pattern VC2 is integrally provided with electrode patterns to which the ground potential VSSQ is supplied. Naturally, the electrode patterns VC1 and VC2 are laid out to be sandwiched between other electrode patterns to which other potentials or signals are supplied, while being away from these other electrode patterns to avoid contact between the electrode patterns VC1 and VC2 and these other electrode patterns. Needless to mention, the electrode pattern VC1 and the electrode pattern VC2 are also separately provided to avoid mutual contact.

Figure 9:
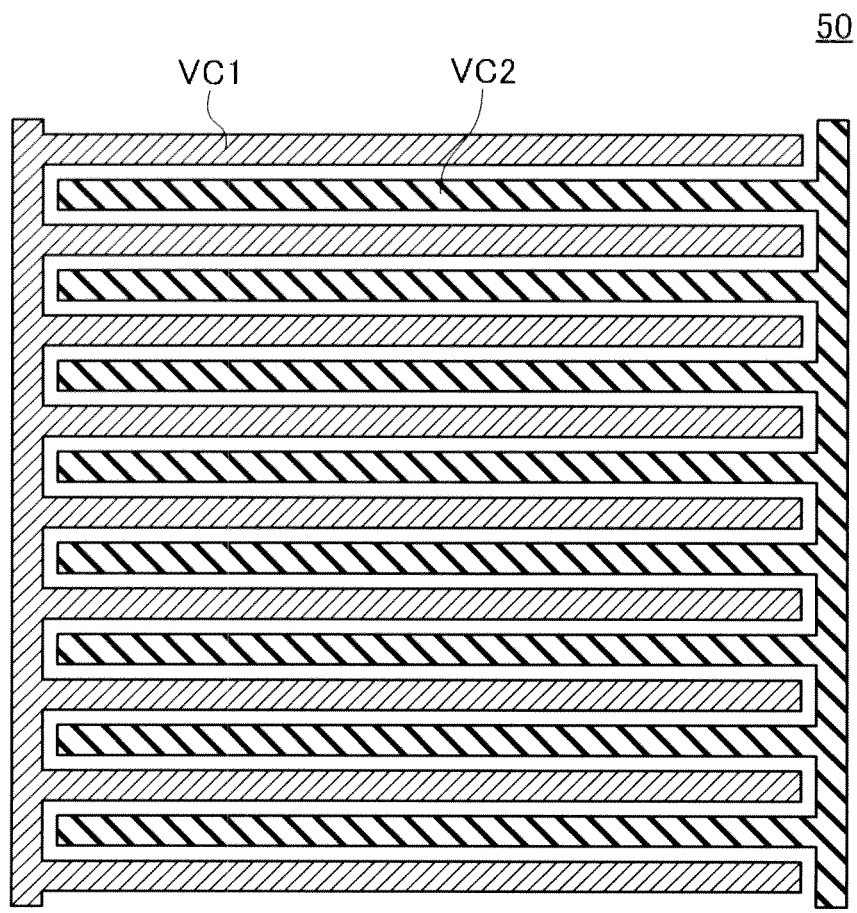
FIG. 9 is an enlarged plan view of an area 50 shown in FIG. 8.

The electrode patterns VC1 and VC2 are alternately arranged to be adjacent to each other as shown in FIG. 9, which is an enlarged diagram of a region 50. That is, the electrode patterns VC1 and VC2 formed in a comb shape are arranged to mesh each other. With this configuration, because a power compensation capacitor is formed by the electrode patterns VC1 and VC2, the power supply potential VDDQ and the ground potential VSSQ can be stabilized. Furthermore, because the electrode patterns VC1 and VC2 are provided in the free space within the penetration electrode forming area DQA1, a chip area does not increase. Needless to mention, also in the penetration electrode forming areas DQA2 to DQA8, power compensation capacitors are also provided by the electrode patterns VC1 and VC2 in the same manner.

A layout pattern according to the second embodiment of the present invention will be explained with reference to FIG. 10.

Figure 10:
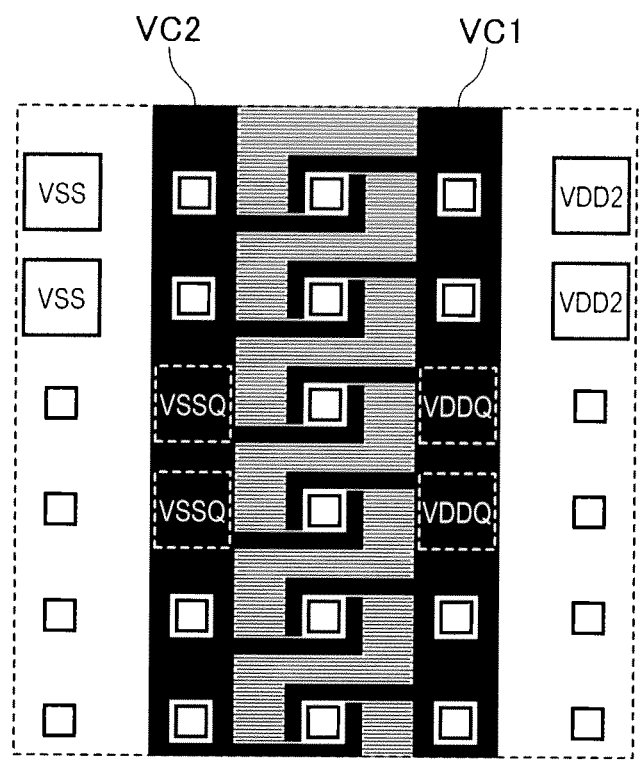
FIG. 10 is a plan view of the penetration electrode forming area according to a second embodiment of the present invention.

FIG. 10 shows a layout of the wiring layer L1 in the penetration electrode forming area DQA1. The electrode patterns VC1 and VC2 having a larger area are provided in the free space of the wiring layer L1 shown in FIG. 7A. Therefore, some of the electrode patterns for a signal are in a state of being surrounded by the electrode pattern VC1 or VC2. In an example shown in FIG. 10, in order to provide the electrode patterns VC1 and VC2 having a larger area in the wiring layer L1, the data wiring patterns SL provided in the wiring layer L1 in FIG. 8 are shifted to other wiring layers such as wiring layers L2, for example. With this arrangement, a capacitance value of the power compensation capacitor constituted by the electrode patterns VC1 and VC2 can be further increased.

Figure 11:
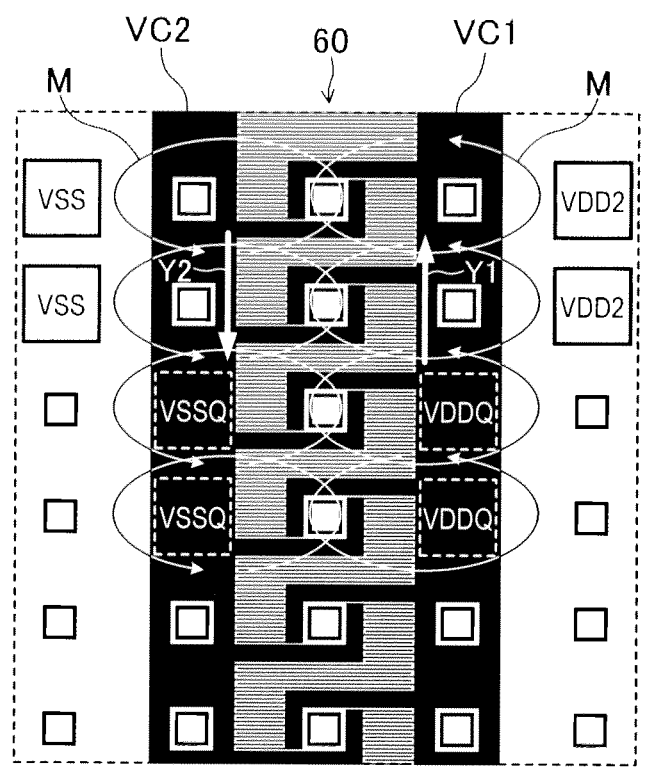
FIG. 11 is a plan view for explaining the reason why the inductance of power supply wirings can be reduced.

Furthermore, in the second embodiment, because the electrode patterns VC1 and VC2 are extended in parallel to the Y direction, magnetic fields that are excited by a current flowing in the electrode patterns VC1 and VC2 cancel each other. With this configuration, the inductance of power supply wirings can be reduced. FIG. 11 is a plan view for explaining this principle. A current flows in the electrode pattern VC1 along a Y1 direction, and a current flows in the electrode pattern VC2 along a Y2 direction, which is different by 180 degrees from the Y1 direction. Therefore, magnetic fields M are cancelled in a region 60 that is sandwiched between the electrode pattern VC1 and the electrode pattern VC2. As a result, the inductance components that are parasitic in the power supply wirings can be reduced.

A layout pattern according to the third embodiment of the present invention will be explained with reference to FIG. 12.

Figures 12A, 12B:
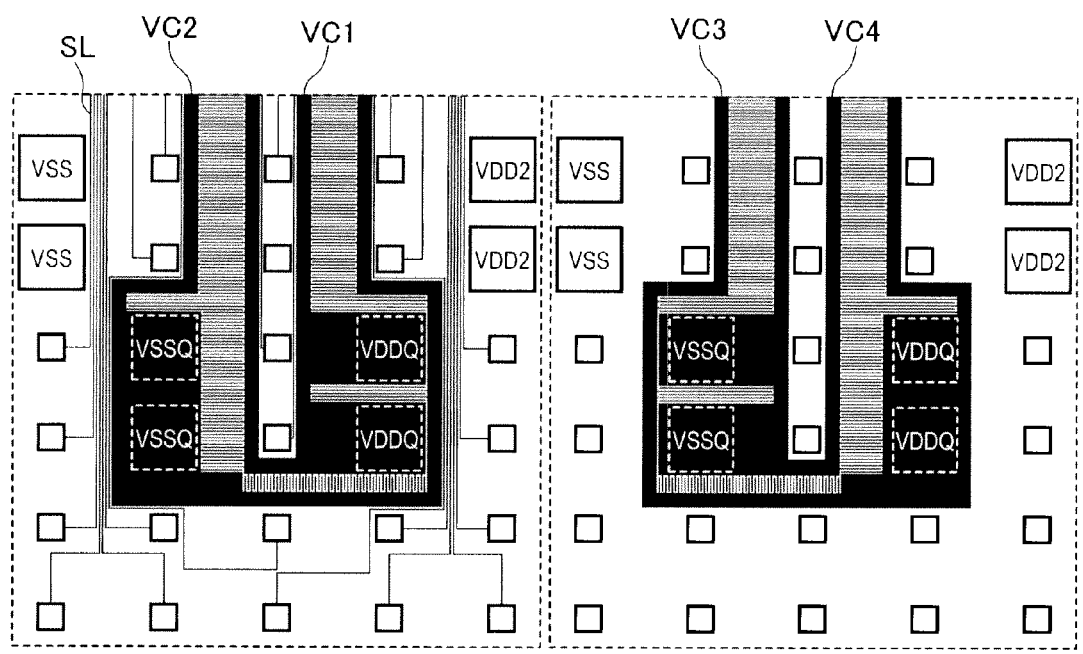
FIGS. 12A and 12B are plan views of the penetration electrode forming area according to a third embodiment of the present invention.

FIG. 12A shows a layout of the wiring layer L1 in the penetration electrode forming area DQA1, and FIG. 12B shows a layout of the wiring layer L2 in the penetration electrode forming area DQA1. In the third embodiment, the electrode patterns VC1 and VC2 are provided in the free space of the wiring layer L1 shown in FIG. 7A, and electrode patterns VC3 and VC4 are provided in a free space of the wiring layer L2 shown in FIG. 7B. The layout of the electrode patterns VC1 and VC2 is the same as that of the patterns shown in FIG. 8.

As shown in FIG. 12B, the electrode pattern VC3 is integrally provided with electrode patterns to which the power supply potential VDDQ is supplied, and the electrode pattern VC4 is integrally provided with electrode patterns to which the power supply potential VSSQ is supplied. Naturally, the electrode patterns VC3 and VC4 are also laid out to avoid contact with other electrode patterns to which other potentials or signals are supplied. Needless to mention, the electrode pattern VC3 and the electrode pattern VC4 are also separately provided to avoid mutual contact. The electrode patterns VC3 and VC4 are formed in a comb shape and are arranged to mesh each other in a similar manner to that of the electrode patterns VC1 and VC2. With this arrangement, a power compensation capacitor is also formed by the electrode patterns VC3 and VC4.

Figure 13:
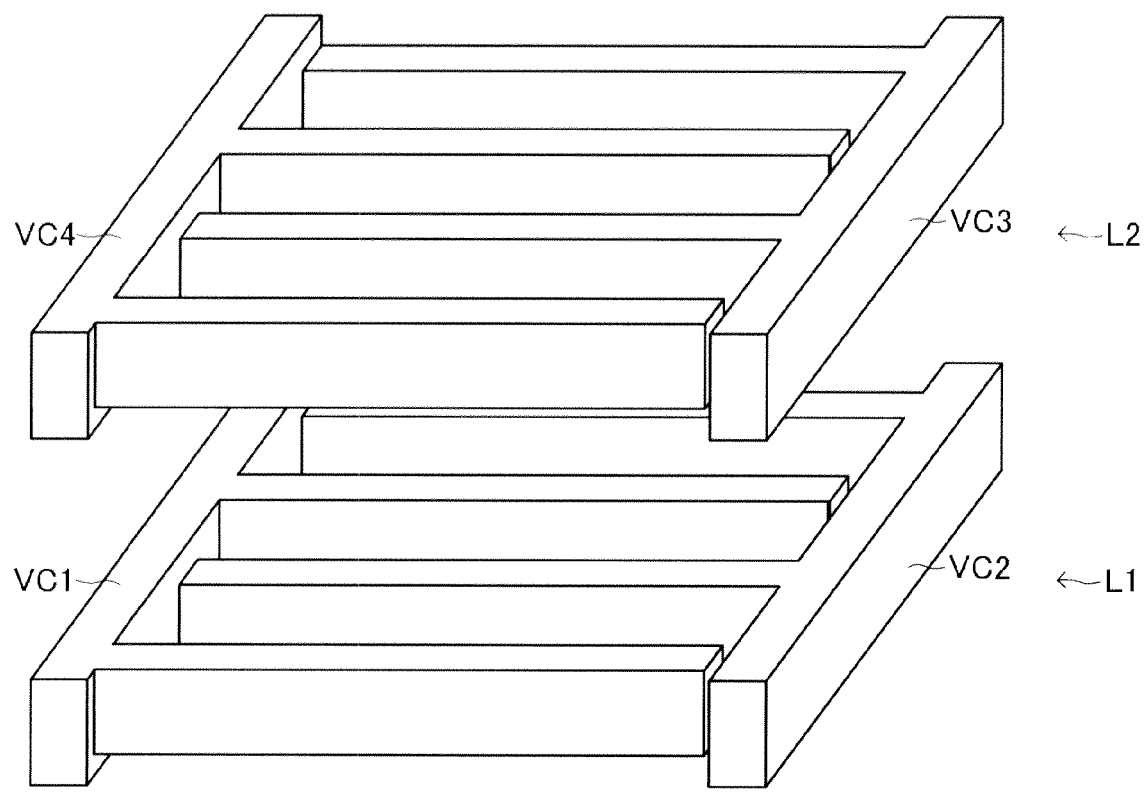
FIG. 13 is a schematic diagram for explaining a stereoscopic positional relationship of the electrode patterns in the third embodiment.

As shown in FIG. 13, the electrode pattern VC4 overlaps the electrode pattern VC1 in a planar view, and the electrode pattern VC3 overlaps the electrode pattern VC2 in a planar view. With this arrangement, a power compensation capacitor is also formed by the electrode patterns VC1 and VC4, and a power compensation capacitor is also formed by the electrode patterns VC2 and VC3. In this manner, in the third embodiment, the electrode patterns that mesh each other in a comb shape are provided in two layers of the wiring layers L1 and L2, and also the electrode patterns are laid out to face each other between the wiring layers. Therefore, capacitance values of the power compensation capacitors can be further increased.

Figure 14:
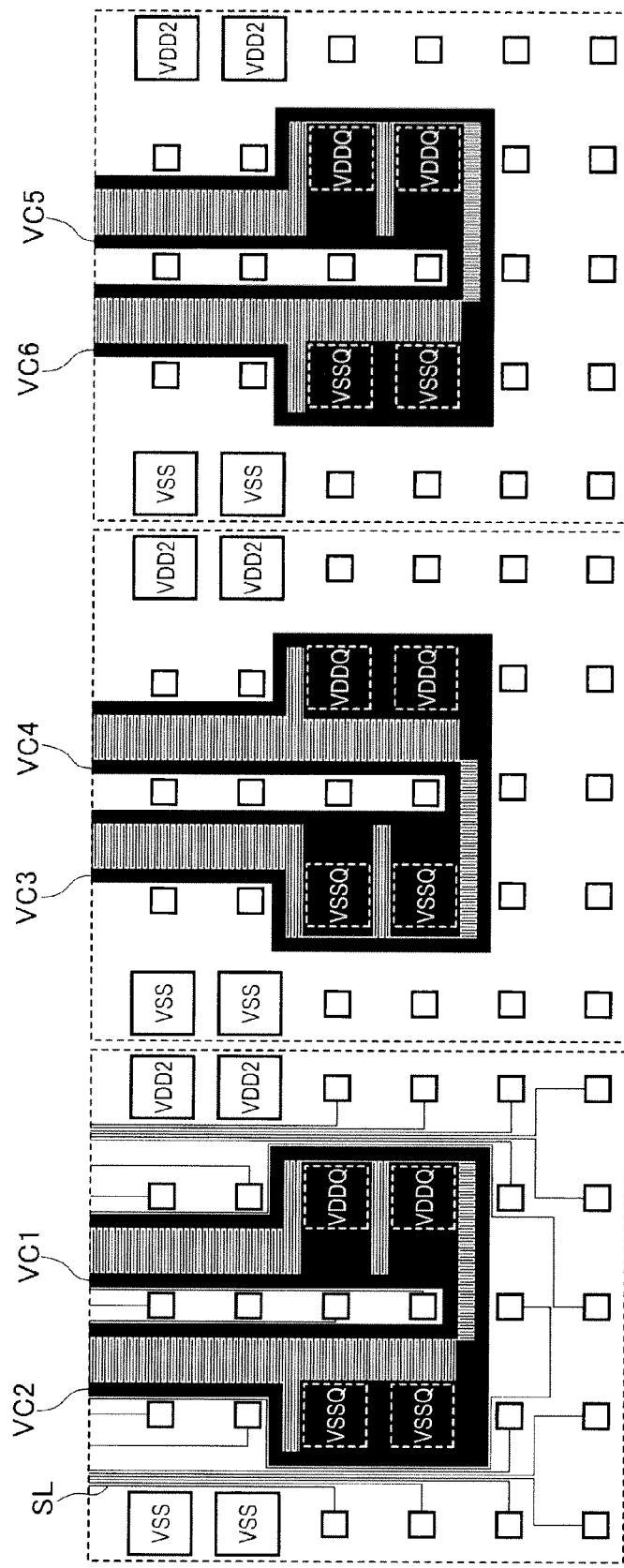
FIGS. 14A to 14C are plan views of the penetration electrode forming area according to a fourth embodiment of the present invention.

A layout pattern according to the fourth embodiment of the present invention will be explained with reference to FIG. 14.

FIGS. 14A to 14C respectively show layouts of the wiring layers L1 to L3 in the penetration electrode forming area DQA1. In the fourth embodiment, the electrode patterns VC1 and VC2 are provided in the free space of the wiring layer L1 shown in FIG. 7A, the electrode patterns VC3 and VC4 are provided in the free space of the wiring layer L2 shown in FIG. 7B, and electrode patterns VC5 and VC6 are provided in a free space of the wiring layer L3 shown in FIG. 7C. Each of the layouts of the electrode patterns VC1 and VC2 is the same as that of the patterns shown in FIG. 12. When there are only few free spaces in the wiring layer L3, it suffices to shift the power supply wiring patterns VL to another wiring layer (a wiring layer L4, for example).

As shown in FIG. 14C, the electrode pattern VC5 is integrally provided with electrode patterns to which the power supply potential VDDQ is supplied, and the electrode pattern VC6 is integrally provided with electrode patterns to which the ground potential VSSQ is supplied. Naturally, the electrode patterns VC5 and VC6 are also laid out to avoid contact with other electrode patterns to which other potentials or signals are supplied. Needless to mention, the electrode pattern VC5 and the electrode pattern VC6 are also separately provided to avoid mutual contact. The electrode patterns VC5 and VC6 are formed in a comb shape and are arranged to mesh each other in a similar manner to that of the electrode patterns VC1 to VC4. With this arrangement, a power compensation capacitor is also formed by the electrode patterns VC5 and VC6.

Figure 15:
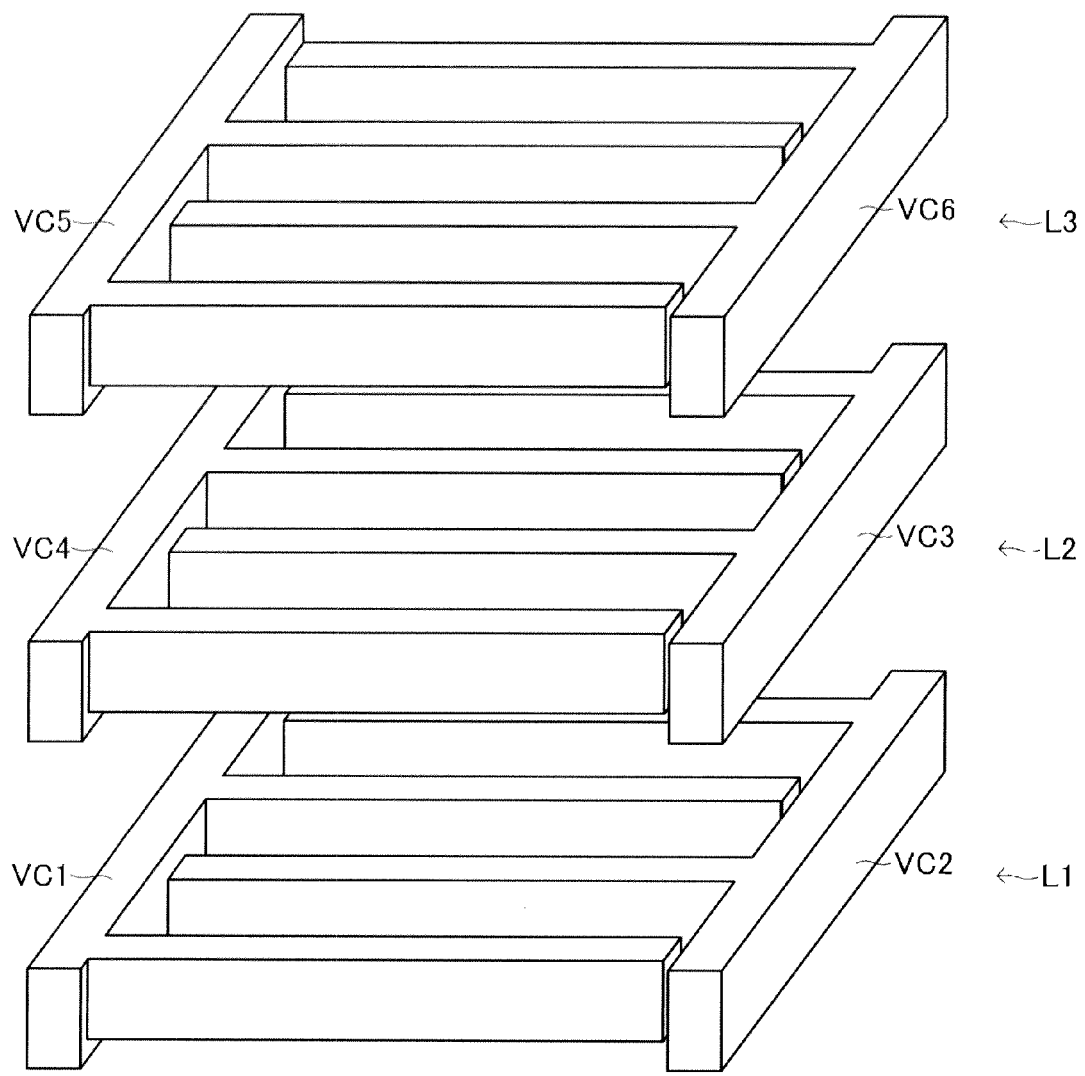
FIG. 15 is a schematic diagram for explaining a stereoscopic positional relationship of the electrode patterns in the fourth embodiment.

As shown in FIG. 15, the electrode pattern VC4 overlaps the electrode pattern VC1 in a planar view and the electrode pattern VC5 overlaps the electrode pattern VC1 in a planar view. In a similar way, the electrode pattern VC3 overlaps the electrode pattern VC2, the electrode pattern VC6 overlaps the electrode VC3 in a planar view. With this arrangement, a power compensation capacitor is also formed by the electrode patterns VC4 and VC5, and a power compensation capacitor is also formed by the electrode patterns VC3 and VC6. In this manner, in the fourth embodiment, the electrode patterns that mesh each other in a comb shape are provided in three layers of the wiring layers L1 to L3, and also the electrode patterns are laid out to face each other between the wiring layers.

Therefore, capacitance values of the power compensation capacitors can be further increased.

A layout pattern according to the fifth embodiment of the present invention will be explained with reference to FIG. 16.

Figure 16:
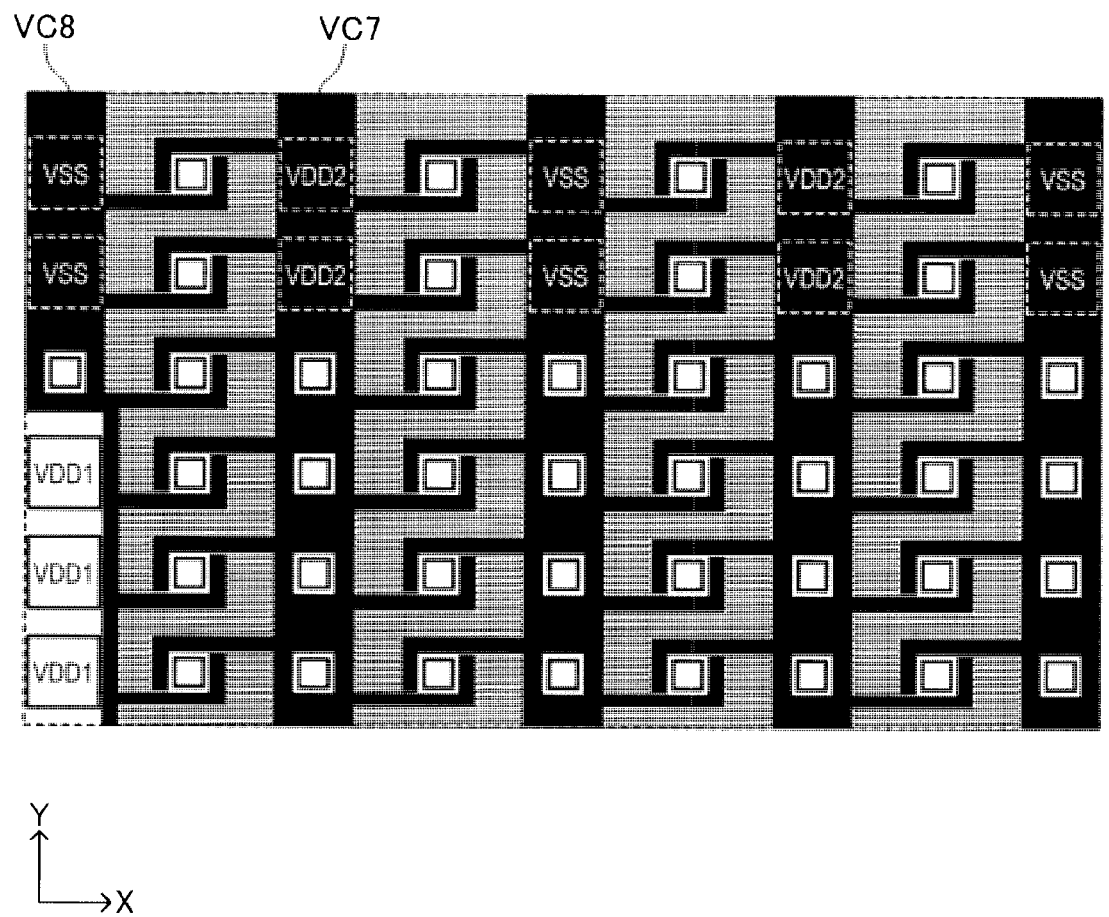
FIG. 16 is a plan view of the penetration electrode forming area according to a fifth embodiment of the present invention.

As shown in FIG. 16, a total of 54 electrode patterns are formed in the wiring layer L1 of the penetration electrode forming area CAA, which are nine electrode patterns in the X direction and six electrode patterns in the Y direction. The 54 electrode patterns are connected respectively to penetration electrodes TSV. Electrode patterns of a power supply system that are arranged in the penetration electrode forming area CAA include patterns to which the power supply potentials VDD1 and VDD2 are supplied, and patterns to which the ground potential VSS is supplied. A pair of capacitor electrodes formed by electrode patterns VC7 and VC8 is mutually adjacently provided in the free space of the wiring layer L1. As shown in FIG. 16, the electrode pattern VC7 is integrally provided with electrode patterns to which the power supply potential VDD2 is supplied, and the electrode pattern VC8 is integrally provided with electrode patterns to which the ground potential VSS is supplied. Naturally, the electrode patterns VC1 and VC2 are laid out to avoid contact with other electrode patterns to which other potentials or signals are supplied. Needless to mention, the electrode pattern VC7 and the electrode pattern VC8 are also separately provided to avoid mutual contact.

Similarly to the first to fourth embodiments, the electrode patterns VC7 and VC8 are formed in a comb shape and mesh each other. With this arrangement, because a power compensation capacitor is also formed by the electrode patterns VC7 and VC8 in the penetration electrode forming area CAA, the power supply potential VDD2 and the ground potential VSS can be stabilized.

Figure 17:
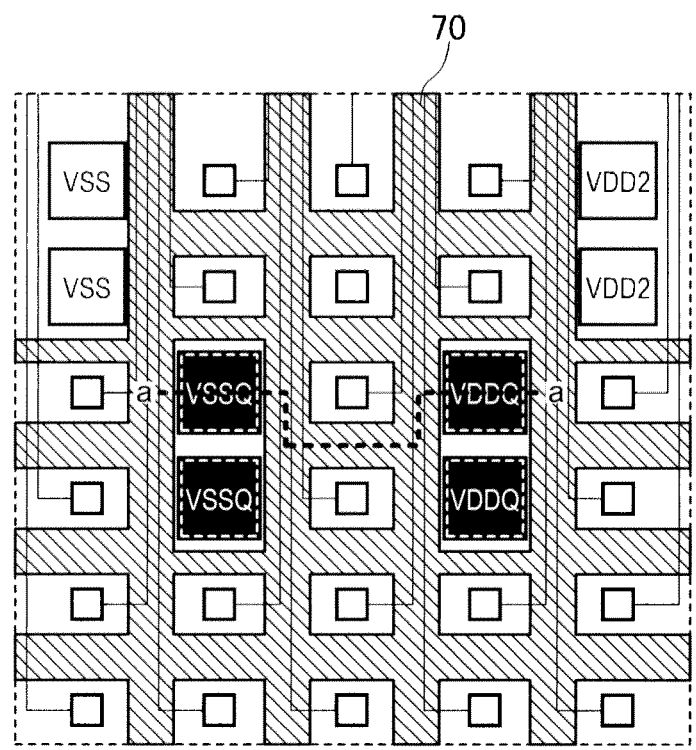
FIG. 17 is a plan view of the penetration electrode forming area according to a sixth embodiment of the present invention.

A layout pattern according to the sixth embodiment of the present invention will be explained with reference to FIG. 17. FIG. 17 shows a layout of the wiring layer L1 in the penetration electrode forming area DQA1. A hatched region 70 is a region where power compensation capacitors having the same cell capacitors as those included in memory cell arrays are provided.

Figure 18:
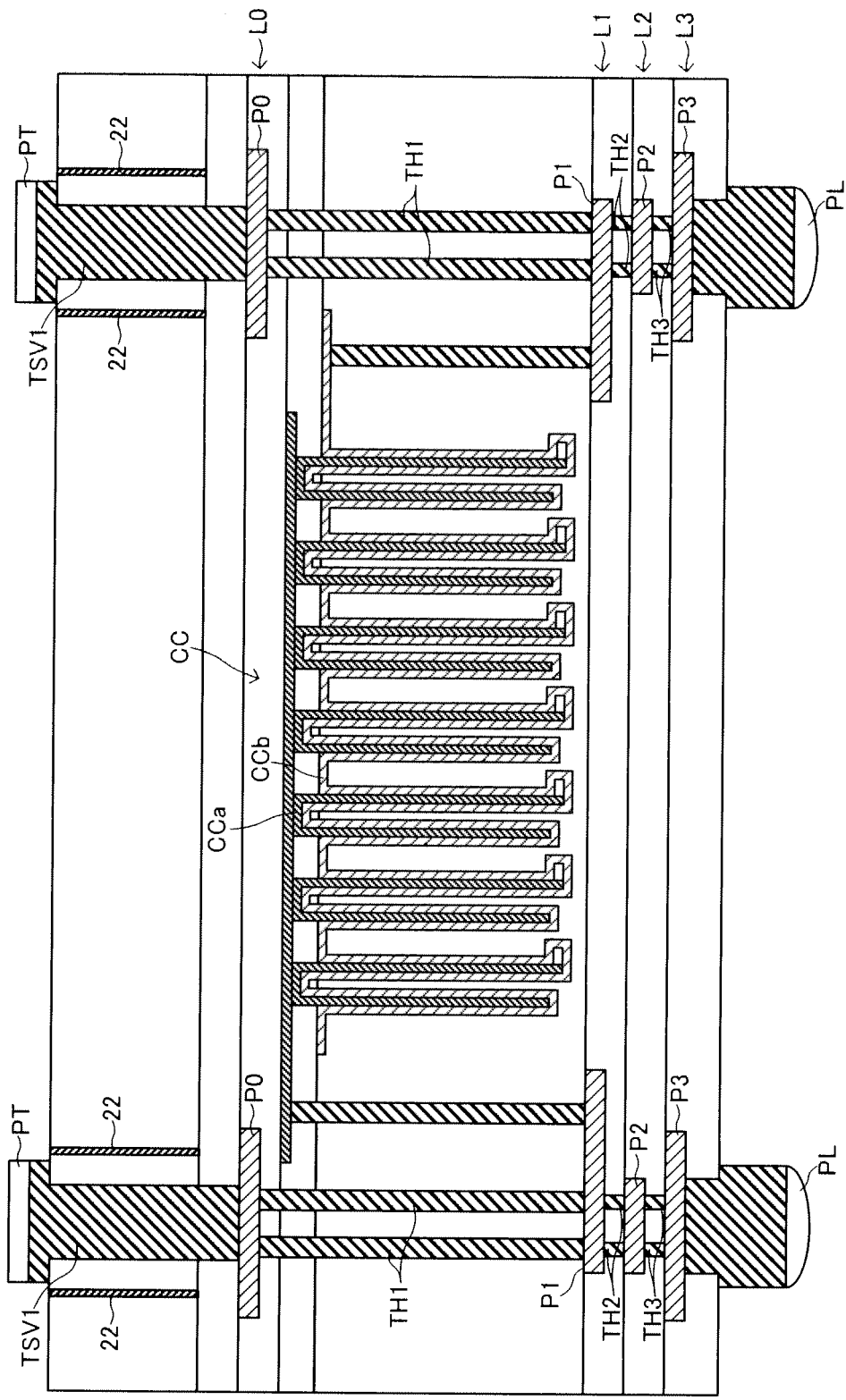
FIG. 18 is a cross-sectional view taken along a line a-a shown in FIG. 17.

As shown in FIG. 18, in the sixth embodiment, a plurality of cell capacitors CC that constitute power compensation capacitors are provided between the wiring layer L0 and the wiring layer L1. Each cell capacitor CC includes a cylindrical lower electrode CCa and an upper electrode CCb that covers the power compensation capacitor. A capacitance dielectric film (not shown) is provided between the lower electrode CCa and an upper electrode CCb. The lower electrode CCa of the cell capacitor CC is connected in common to the electrode patterns to which the ground potential VSSQ is supplied. On the other hand, the upper electrode CCb of the cell capacitor CC is connected in common to the electrode patterns to which the power supply potential VDDQ is supplied.

Power compensation capacitors are constituted by the cell capacitors CC in the configuration described above. The penetration electrode forming area DQA1 is essentially a region in which the cell capacitors CC are not formed, and a region between the wiring layer L0 and the wiring layer L1 is a free space that is not used. In the sixth embodiment, power compensation capacitors are formed by using such a free space. The cell capacitors CC that are used for power compensation capacitors can be simultaneously manufactured with cell capacitors within the memory cell arrays, and therefore the number of manufacturing processes does not increase.

Figure 19:
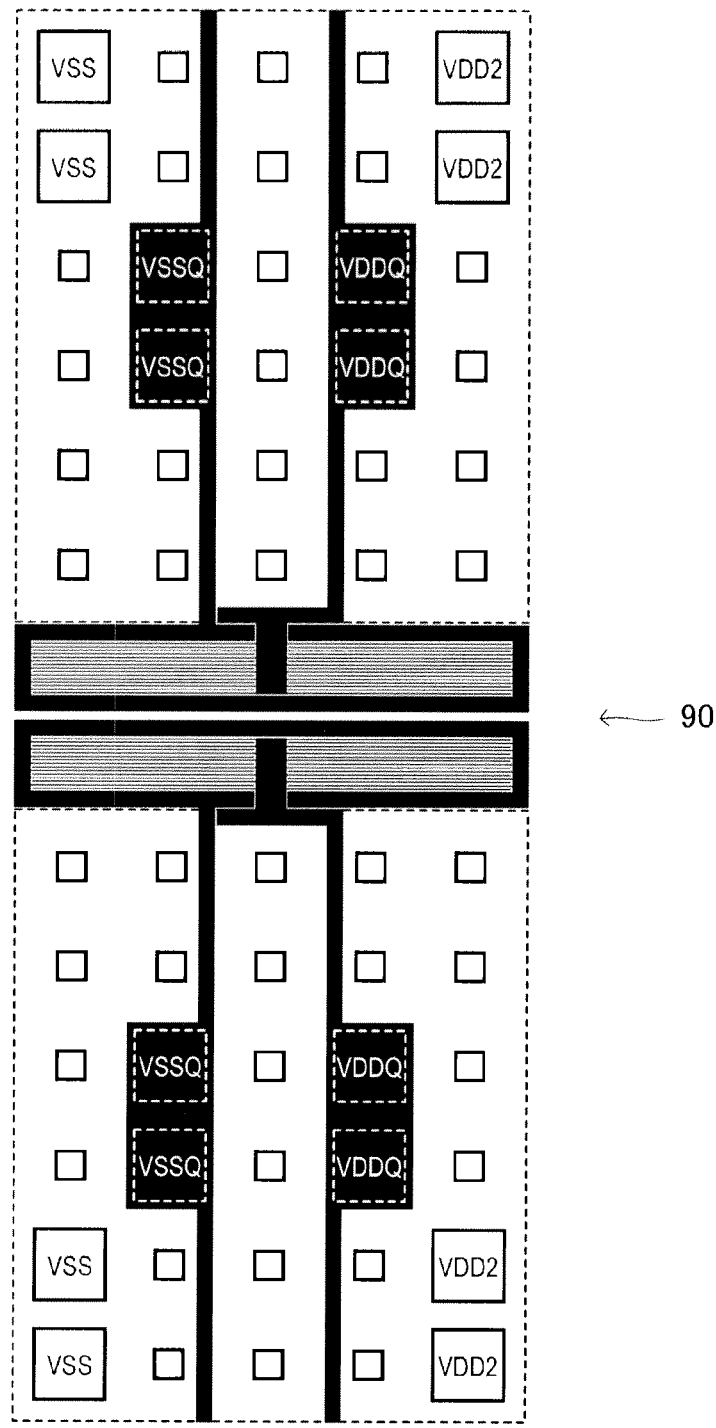
FIG. 19 is an enlarged layout diagram of a region 80 shown in FIG. 5 according to a seventh embodiment of the present invention.

A layout pattern according to the seventh embodiment of the present invention will be explained with reference to FIG. 19. FIG. 19 shows a layout of the wiring layer L1 in the penetration electrode forming area DQA1.

As shown in FIG. 19, in the seventh embodiment, power compensation capacitors are also provided in a penetration electrode non-forming area 90 that is sandwiched by the penetration electrode forming area in which the terminal PL_a for the channel Ch_a is arranged and by a region in which the terminal PL_d for the channel Ch_d is arranged. As shown in FIG. 3, although the penetration electrode non-forming area 90 is the terminal region B in which the test pads TP are arranged, power compensation capacitors can be arranged in this area because the wiring density in this area is low.

Figure 20:
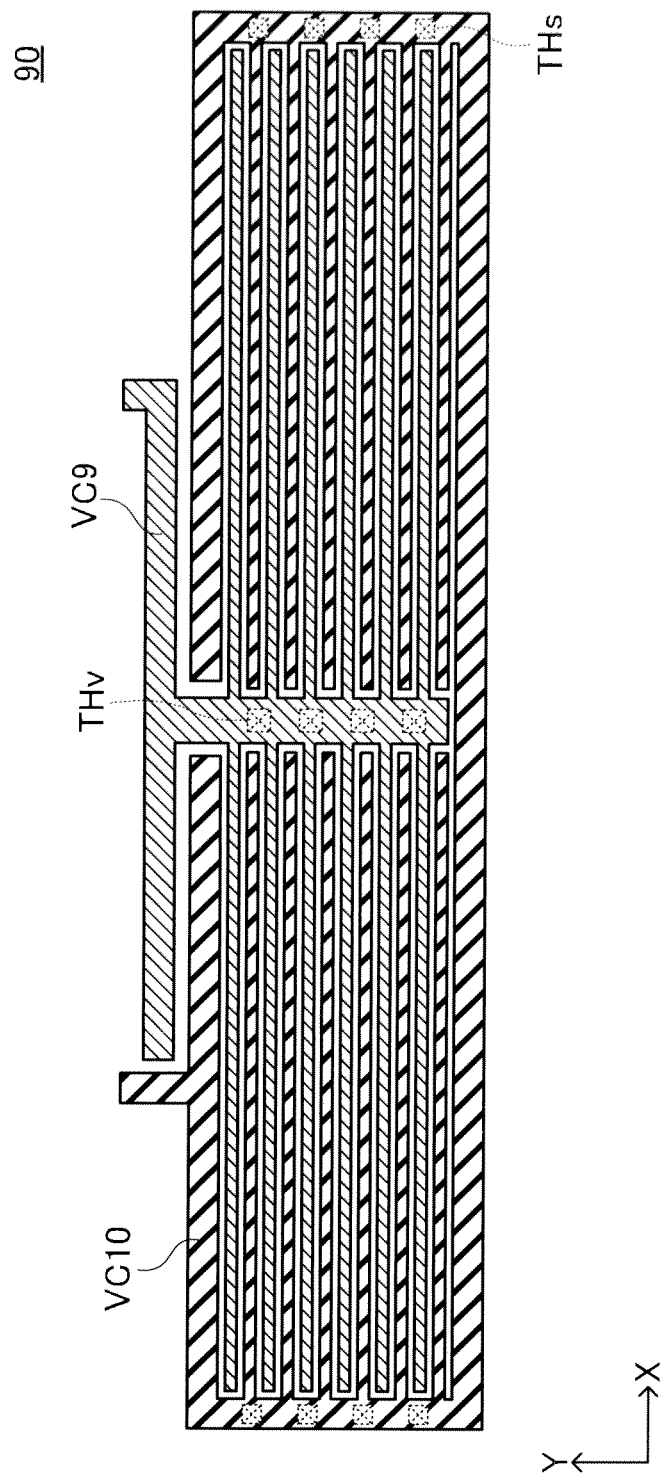
FIG. 20 is an enlarged layout diagram of the penetration electrode non-forming area 90 shown in FIG. 19.
Figure 21:
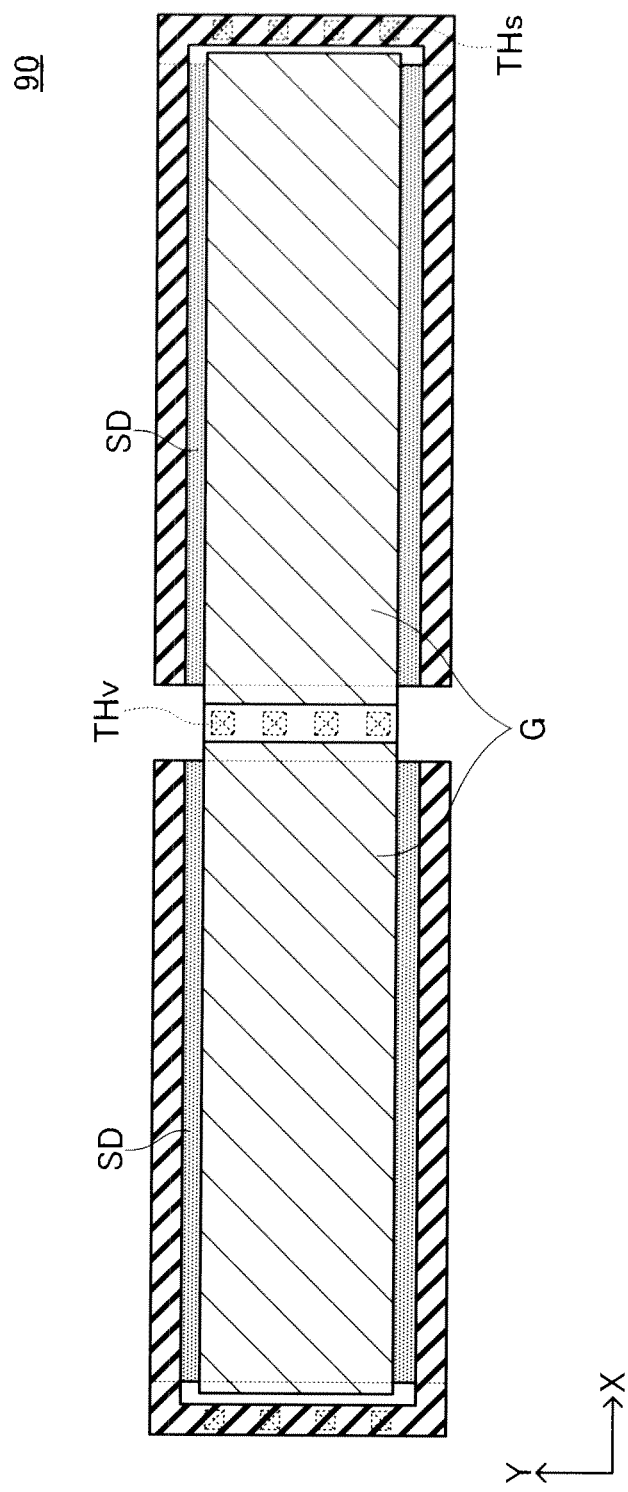
FIG. 21 is an enlarged layout diagram of a vicinity of a diffusion layer region positioned at a lower part of the penetration electrode non-forming area 90 shown in FIG. 19.

As shown in FIG. 20, similarly to the above embodiments, electrode patterns VC9 and VC10 formed in a comb shape are arranged to mesh each other in the penetration electrode non-forming area 90 in the wiring layer L1. With this arrangement, a power compensation capacitor is also formed by the electrode patterns VC9 and VC10 in the penetration electrode non-forming area 90. Furthermore, the electrode pattern VC9 positioned at a central part of the penetration electrode non-forming area 90 in the X direction is connected to a gate electrode G shown in FIG. 21 via a through-hole conductor THv. On the other hand, the electrode pattern VC10 positioned at an end part of the penetration electrode non-forming area 90 in the X direction is connected to a diffusion layer region SD shown in FIG. 21 via a through-hole conductor THs. The gate electrode G is provided to cover the diffusion layer region SD, and, with this arrangement, a MOS capacitor is configured. Consequently, capacitance values of power compensation capacitors further increase. The arrangement of such a MOS transistor becomes possible because elements like transistors are hardly formed in the terminal region B in which the test pads TP are arranged.

As described above, in each of the embodiments of the present invention, because power compensation capacitors are arranged in penetration electrode forming areas, a power supply voltage can be stabilized without increasing a chip area.

It is apparent that the present invention is not limited to the above embodiments, but may be modified and changed without departing from the scope and spirit of the invention.

For example, although the present invention has been explained by exemplifying a so-called wide I/O DRAM in the above embodiments, application targets of the present invention are not limited thereto, and the present invention can be also applied to all semiconductor devices that include the penetration electrodes TSV.

What is claimed is:

1. A device comprising:
   first and second memory cell arrays arranged in a first direction;
   a plurality of first bump electrodes disposed between the first and second memory cell arrays and arranged in line in a second direction crossing the first direction;
   a plurality of second bump electrodes disposed between the first bump electrodes and the second memory cell arrays and arranged in line in the second direction;
   a first area being between the first and second bump electrodes; a plurality of third bump electrodes disposed in the first area;
   a first capacitor formed in the first area;
   a first power supply bump electrode being one of the first, second and third bump electrodes and supplied with a first power supply voltage;
   a second power supply bump electrode being one of remaining ones of the first, second and third bump electrodes and supplied with a second power supply voltage different from the first power supply voltage;
a first interconnection line including a first portion that is vertically arranged with and coupled to the first power supply bump and a second portion that is disposed in the first area; and
a second interconnection line including a third portion that is vertically arranged with and coupled to the second power supply bump and a fourth portion that is disposed in the first area;
wherein the first capacitor includes first and second electrodes, the second portion of the first interconnection line serves as the first electrode of the capacitor and the fourth portion of the second interconnection line serves as the second electrode of the capacitor.

2. The device as claimed in claim 1, wherein each of the first and second interconnection line is formed as a first wiring layer.

3. The device as claimed in claim 2, further comprising:
a semiconductor substrate,
a multi-level wiring layer including the first wiring layer and a second wiring layer formed over the first wiring layer,
a third interconnection line formed as the second wiring layer and including a fifth portion that is vertically arranged with and coupled to the first power supply bump and a sixth portion that disposed in the first area and vertically arranged with the fourth portion of the second interconnection line, the sixth portion serving as the first electrode of the first capacitor, and
a fourth interconnection line formed as the second wiring layer and including a seventh portion that is vertically arranged with and coupled to the second power supply bump electrode and an eighth portion that is disposed in the first area and vertically arranged with the second portion of the first interconnection line, the eighth portion serving as the second electrode of the first capacitor.

4. The device as claimed in claim 3, wherein the multi-level wiring layer further includes a third wiring layer formed over the first and second wiring layers, the device further comprises:
a fifth interconnection line formed as the third wiring layer and including a ninth portion that is vertically arranged with and coupled to the first power supply bump and a tenth portion that is disposed in the first area and vertically arranged with the second and portion of the first interconnection line and the eighth portion of the fourth interconnection line, the tenth portion serving as the first electrode of the first capacitor, and
a sixth interconnection line formed as the third wiring layer and including an eleventh portion that is vertically arranged with and coupled to the second power supply bump electrode and a twelfth portion that is disposed in the first area and vertically arranged with the fourth portion of the second interconnection line and sixth portion of the third interconnection line, the twelfth portion serving as the second electrode of the first capacitor.

5. The device as claimed in claim 1, wherein each of the first and second memory cell arrays includes a plurality of storage capacitors and the first capacitor is substantially equal in structure to each of the storage capacitors.

6. The device as claimed in claim 1, further comprising a semiconductor substrate, and wherein the first area includes a diffusion layer formed in the semiconductor substrate and a gate electrode formed on the diffusion layer with an intervention of an insulating film, the first capacitor includes first and second electrodes, the diffusion layer serves as the first electrode of the capacitor and the electrode serves as the second electrode of the capacitor.

7. The device as claimed in claim 6, further comprising:
a first power supply bump electrode being one of the first, second and third bump electrodes and supplied with a first power supply voltage, the first power supply bump being electrically coupled to the diffusion layer, and
a second power supply bump electrode being one of remaining ones of the first, second and third bump electrodes and supplied with a second power supply voltage different from the first power supply voltage, the second power supply bump being electrically coupled to the gate electrode.

8. The device as claimed in claim 1, further comprising:
a semiconductor substrate,
a plurality of first penetration electrodes penetrating the semiconductor substrate, each of the first penetration electrodes being coupled to a corresponding one of the first bump electrodes,
a plurality of second penetration electrodes penetrating the semiconductor substrate, each of the second penetration electrodes being coupled to a corresponding one of the second bump electrodes, and
a plurality of third penetration electrodes penetrating the semiconductor substrate and disposed in the first area, each of the third penetration electrodes being coupled to a corresponding one of the third bump electrodes.

9. A device comprising:
first and second memory cell arrays;
a first data input/output circuit that performs a data transfer from and to the first memory cell array;
a second data input/output circuit that performs a data transfer from and to the second memory cell array;
a plurality of first bump electrodes arranged in a first area which is positioned between the first data input/output circuit and the second data input/output circuit;
a power compensation capacitor provided in the first area; and
first and second electrode patterns each formed as a first wiring layer, wherein the first bump electrodes include a first one of the first bump electrodes connected to the first electrode pattern and supplied with a first power supply potential, and a second one of first bump electrodes connected to the second electrode pattern and supplied with a second power supply potential which is different from the first power supply potential, the first and second ones of the first bump electrodes coupled respectively to the first and second electrode patterns, and the power compensation capacitor includes a first capacitor electrode including a first portion that extends from the first electrode pattern as the first wiring layer, and a second capacitor electrode including a second portion that extends from the second electrode pattern as the first wiring layer.

10. The device as claimed in claim 9, further comprising:
a substrate, and
a plurality of penetration electrodes each penetrating through the substrate, each of the penetration electrodes being connected to a corresponding one of the first bump electrodes.

11. The device as claimed in claim 9, wherein the first bump electrodes further include a third one of the first bump electrodes that is connected to the first data input/output circuit, the third one of the first bump electrodes being connected to a signal electrode pattern that is formed as the first wiring layer, and the signal electrode pattern is surrounded by the first or second capacitor electrode.

12. The device as claimed in claim 9, wherein the first one of the first bump electrodes is connected to a third electrode pattern that is formed as a second wiring layer which is different from the first wiring layer, the second one of the first bump electrodes is connected to a fourth electrode pattern that is formed as the second wiring layer, the first capacitor electrode includes a third portion that extends from the third electrode pattern as the second wiring layer, the second capacitor electrode includes a fourth portion that extends from the fourth electrode pattern as the second wiring layer, a part of the first portion of the first capacitor electrode and a part of the fourth portion of the second capacitor electrode are vertically overlapped, and a part of the second portion of the first capacitor electrode and a part of the third portion of the second capacitor electrode are vertically overlapped.

13. The device as claimed in claim 12, wherein the first one of the first bump electrodes is connected to a fifth electrode pattern that is formed as a third wiring layer which is different from the first and second wiring layers, the second one of the first bump electrodes is connected to a sixth electrode pattern that is formed as the third wiring layer, the first capacitor electrode includes a fifth portion that extends from the fifth electrode pattern as the third wiring layer, the second capacitor electrode includes a sixth portion that extends from the sixth electrode pattern as the third wiring layer, a part of the fifth portion of the first capacitor electrode and the part of the fourth portion of the second capacitor electrode are vertically overlapped, and the part of the second portion of the first capacitor electrode and a part of the sixth portion of the second capacitor electrode are vertically overlapped.

14. The device as claimed in claim 10, wherein the first bump electrodes further include one of the first bump electrodes supplied with an address signal or a command signal.

15. The device as claimed in claim 9, wherein the first and second memory cell arrays include a plurality of cell capacitors, and at least a part of the power compensation capacitor has a configuration that is substantially the same as a configuration of the cell capacitor.

16. The device as claimed in claim 9, further comprising:
a plurality of second bump electrodes arranged in a second area which is positioned between the first area and the second data input/output circuit; and
a third area in which any bump electrode is not arranged, the third area being arranged in one direction between the first and second areas, and
at least a part of the power compensation capacitor is arranged in the third area.

17. The device as claimed in claim 16, wherein the second bump electrodes include one of the second bump electrodes that is connected to the second data input/output circuit.

18. The device as claimed in claim 16, wherein at least a part of the power compensation capacitor that is provided in the third area is constituted by a MOS capacitor.

* * * * *